(12) United States Patent
Kumagai

(10) Patent No.: US 11,387,821 B2
(45) Date of Patent: Jul. 12, 2022

(54) PULSE SIGNAL SENDING CIRCUIT

(71) Applicant: Keizo Kumagai, Inagi (JP)

(72) Inventor: Keizo Kumagai, Inagi (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 17/163,374

(22) Filed: Jan. 30, 2021

(65) Prior Publication Data

US 2021/0258002 A1 Aug. 19, 2021

(30) Foreign Application Priority Data

Feb. 17, 2020 (JP) .............................. JP2020-023967

(51) Int. Cl.
*H03K 5/13* (2014.01)
*H03K 5/01* (2006.01)
*H03K 19/20* (2006.01)
*H03K 5/00* (2006.01)

(52) U.S. Cl.
CPC ............... *H03K 5/01* (2013.01); *H03K 19/20* (2013.01); *H03K 2005/00019* (2013.01)

(58) Field of Classification Search
CPC ...................... H03K 5/01; H03K 19/20; H03K 2005/00019; H03K 5/13; H03K 3/017; H03K 5/04
USPC ......................................................... 327/261
See application file for complete search history.

(56) References Cited

U.S. PATENT DOCUMENTS

| | | | | |
|---|---|---|---|---|
| 5,289,051 A | * | 2/1994 | Zitta | H03K 17/167 327/108 |
| 5,389,829 A | * | 2/1995 | Milazzo | G05F 3/225 327/172 |
| 5,506,532 A | | 4/1996 | Milazo | |
| 5,610,546 A | * | 3/1997 | Carbou | H03K 5/1515 327/261 |
| 5,748,542 A | * | 5/1998 | Zheng | G11C 7/1072 327/261 |
| 5,767,719 A | * | 6/1998 | Furuchi | H03K 5/1515 327/281 |
| 6,121,812 A | * | 9/2000 | Tsukikawa | H03K 5/13 327/280 |
| 6,222,403 B1 | * | 4/2001 | Mitsuda | H03K 17/164 327/170 |

(Continued)

FOREIGN PATENT DOCUMENTS

| | | |
|---|---|---|
| EP | 0590903 A1 | 4/1994 |
| EP | 0963044 A2 | 12/1999 |
| JP | 2004166012 A | 6/2004 |

OTHER PUBLICATIONS

Extended European Search Report (EESR) dated Jul. 8, 2021 issued in European Application No. 21154742.7.

*Primary Examiner* — Ryan Jager

(74) *Attorney, Agent, or Firm* — Holtz, Holtz & Volek PC

(57) ABSTRACT

A pulse signal sending circuit that outputs pulse signals from an output terminal includes: an output transistor; an inverter circuit; and a delay circuit. The output transistor includes a drain terminal connected to the output terminal. The inverter circuit is connected to a gate terminal of the output transistor and outputs a signal to be input to the gate terminal of the output transistor. The delay circuit receives a pulse signal as an input and delays rising or falling of the input pulse signal. The pulse signal delayed by the delay circuit is input to the inverter circuit.

13 Claims, 7 Drawing Sheets

(56) References Cited

U.S. PATENT DOCUMENTS

| | | | | |
|---|---|---|---|---|
| 6,650,152 | B2* | 11/2003 | Kawabata | G05F 3/242 |
| | | | | 327/112 |
| 6,670,822 | B2* | 12/2003 | Freitas | H03K 19/00361 |
| | | | | 326/34 |
| 7,230,467 | B1* | 6/2007 | Gan | H03H 11/26 |
| | | | | 327/261 |
| 7,667,518 | B2* | 2/2010 | Pham | H02M 3/158 |
| | | | | 327/312 |
| 7,734,940 | B2* | 6/2010 | Yamazaki | H03K 19/003 |
| | | | | 713/322 |
| 7,812,647 | B2* | 10/2010 | Williams | H03K 17/18 |
| | | | | 327/110 |
| 8,873,648 | B2* | 10/2014 | Ishizeki | H03K 17/16 |
| | | | | 375/257 |
| 9,780,773 | B2* | 10/2017 | Kawata | H03K 17/08 |
| 10,411,638 | B2* | 9/2019 | Taguchi | H02P 29/024 |
| 2004/0124815 | A1* | 7/2004 | Takimoto | H02M 3/1588 |
| | | | | 323/282 |
| 2013/0076423 | A1* | 3/2013 | Chen | H03K 5/131 |
| | | | | 327/261 |
| 2017/0033555 | A1* | 2/2017 | Taguchi | H02P 29/0241 |
| 2021/0258002 | A1* | 8/2021 | Kumagai | H03K 5/04 |

* cited by examiner

US 11,387,821 B2

1
PULSE SIGNAL SENDING CIRCUIT

CROSS-REFERENCE TO RELATED APPLICATIONS

The entire disclosure of Japanese Patent Application No. 2020-023967 filed on Feb. 17, 2020 is incorporated herein by reference in its entirety.

BACKGROUND

Technical Field

The present disclosure relates to a technology that is effectively applied to a pulse signal sending circuit and a semiconductor integrated circuit that includes a pulse signal sending circuit. In particular, the present disclosure relates to a pulse signal sending circuit that is configured to prevent changes in the pulse width and/or the duty cycle of pulse signals to be sent.

Background Art

A circuit that sends or outputs pulse signals (square-wave signals) may be required to give slopes to the rising and/or falling of output waveforms and reduce changes in the output waveforms in order to deal with electromagnetic interference (EMI). FIG. 9 shows an example of a known pulse signal sending circuit configured to control slopes. The circuit in FIG. 9 includes: a resistance-load inverter that has a resistance element as a load; and a complementary metal oxide semiconductor (CMOS) inverter that precedes the resistance-load inverter and controls on/off of the drive transistor M0 of the resistance-load inverter.

The circuit in FIG. 9 can give desired slopes to the rising or falling of the output waveform with feedback capacitance Crss (=Cgd) of the gate terminal of the drive transistor M0 and with the drive capability of the preceding CMOS inverter that drives the drive transistor MO. By giving slopes to the rising and falling of the output waveform, the circuit can restrain noises that are caused by sharp changes of the waveform.

When square-wave signals IN as shown in the A part of FIG. 10 are input to the preceding CMOS inverter in the pulse signal sending circuit shown in FIG. 9, the pulse signal sending circuit outputs signals the waveform of which gently rises and falls, as shown in the C part of FIG. 10. However, the rising lag time (trise) and the falling lag time (tfall) of the output waveform are not equal. This causes difference in the pulse width and/or duty cycle between output signals OUT and input signals IN. As a result, the circuit may send inappropriate signals in sending pulse signals having a pulse width and duty cycle specified by a receiving circuit or in a system that sends pulse signals the pulse width and/or duty cycle of which have information.

An invention disclosed in JP2004-166012A relates to a pulse width adjusting circuit configured to adjust the pulse width. By providing such a pulse width adjusting circuit in front of the pulse signal sending circuit shown in FIG. 9, the pulse signal sending circuit can send pulse signals having desired pulse width and duty cycle.

The pulse width adjusting circuit disclosed in JP2004-166012A, however, includes two inverters and multiple resistance elements and switching elements, thereby having an increased circuit scale. The resistance elements in par-

2 ticular may greatly upsize the chip of a semiconductor integrated circuit to which the pulse width adjusting circuit is applied.

The present invention has been made in view of the above-described issues. The objects of the present invention include providing a pulse signal sending circuit capable of sending pulse signals having unchanged pulse width and duty cycle, without greatly increasing the circuit scale and the chip size.

The objects of the present invention further include providing a pulse signal sending circuit capable of accurately controlling slopes of output waveforms.

SUMMARY

To achieve at least one of the abovementioned objects, according to an aspect of the present invention, there is provided a pulse signal sending circuit that outputs pulse signals from an output terminal, the circuit including: an output transistor that includes a drain terminal connected to the output terminal; an inverter circuit that is connected to a gate terminal of the output transistor and outputs a signal to be input to the gate terminal of the output transistor; and a delay circuit that receives a pulse signal as an input and delays rising or falling of the input pulse signal, wherein the pulse signal delayed by the delay circuit is input to the inverter circuit.

BRIEF DESCRIPTION OF DRAWINGS

The accompanying drawings are not intended as a definition of the limits of the invention but illustrate embodiments of the invention, and together with the general description given above and the detailed description of the embodiments given below, serve to explain the principles of the invention, wherein.

DESCRIPTION OF EMBODIMENTS

Hereinafter, one or more embodiments of the present invention will be described with reference to the drawings. However, the scope of the present invention is not limited to the disclosed embodiments.

Figure 1:
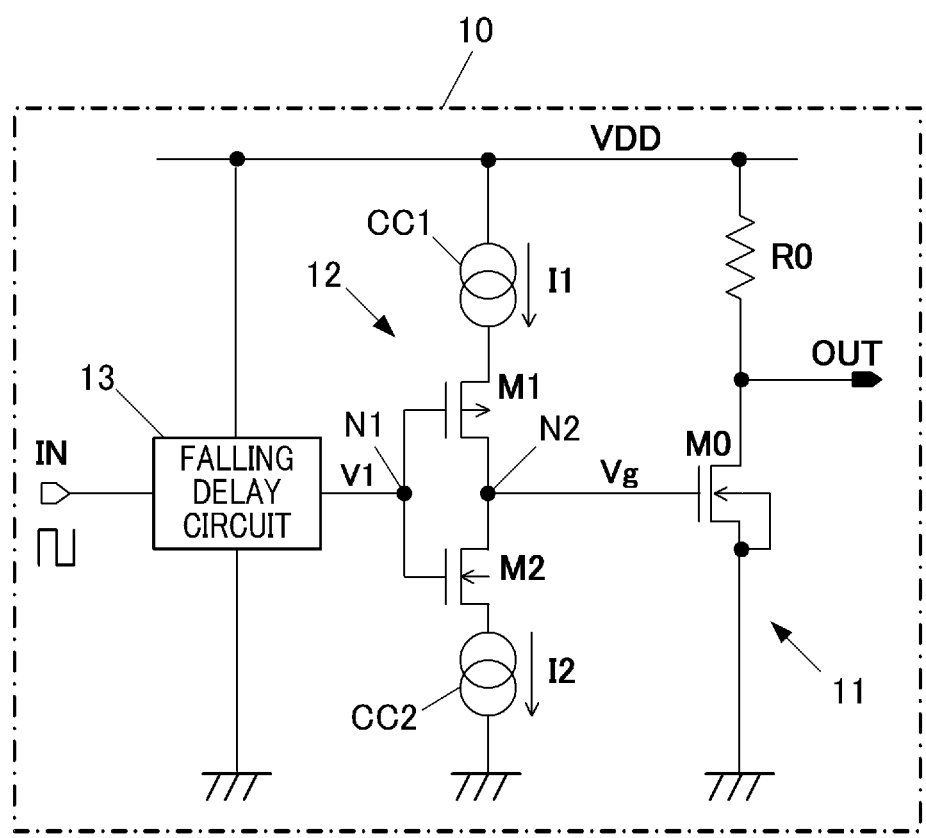
FIG. 1 is a circuit configuration view of a pulse signal sending circuit as an embodiment of the present invention.

FIG. 1 shows a pulse signal sending circuit as an embodiment of the present invention.

As shown in FIG. 1, the pulse signal sending circuit 10 in this embodiment includes an output stage 11, a CMOS inverter circuit 12, and a falling delay circuit 13. The output stage 11 is constituted of a resistance-load inverter. The output stage 11 includes a resistor RO and an N-channel metal-oxide semiconductor (MOS) transistor M0 that are connected in series between a power-supply voltage terminal and a grounding point. The CMOS inverter circuit 12 outputs signals to control on/off of the MOS transistor M0 of the output stage 11. The falling delay circuit 13 outputs, to a connecting node N1 connecting to the CMOS inverter circuit 12, signals that delay the falling of input pulse signals IN.

The CMOS inverter circuit 12 includes: a P-channel MOS transistor M1; an N-channel MOS transistor M2; a constant current source CC1; and a constant current source CC2. The gate terminals of the P-channel and N-channel MOS transistors M1, M2 are connected to each other and receive signals output from the falling delay circuit 13. The constant current source CC1 is connected in series between a power-supply voltage terminal and the P-channel MOS transistor M1. The constant current source CC2 is connected in series between the N-channel MOS transistor M2 and a grounding point. A connecting node N2 connects the MOS transistors M1, M2 and is connected to the gate terminal of the MOS transistor M0 of the output stage 11. The current value I1 of the constant current source CC1 and the current value I2 of the constant current source CC2 are the same, namely I1=I2.

Figure 2A:
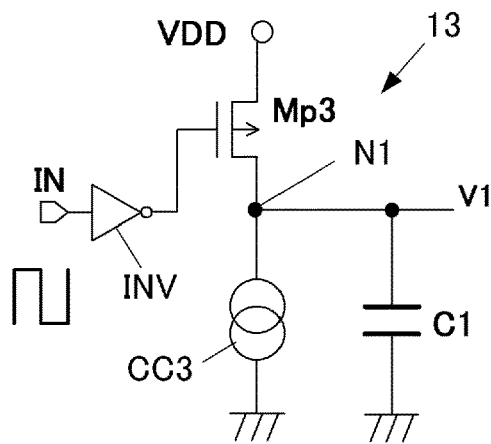
FIGS. 2A, 2B are circuit diagrams each of which shows a specific example of a falling delay circuit constituting the first embodiment.

The falling delay circuit 13 includes: an inverter INV that inverts input signals IN; a P-channel MOS transistor Mp3 and a constant current source CC3 that are connected in series between a power-supply voltage terminal and a grounding point; and a capacitor C1 that is connected between the connecting node N1 and a grounding point, as shown in FIG. 2A as an example. The connecting node N1 connects the MOS transistor Mp3, the constant current source CC3, and the capacitor C1.

The constant current sources CC1, CC2, CC3 may be constituted of current mirror circuits, for example.

Next, operation of the pulse signal sending circuit 10 in this embodiment is described.

Figure 9:
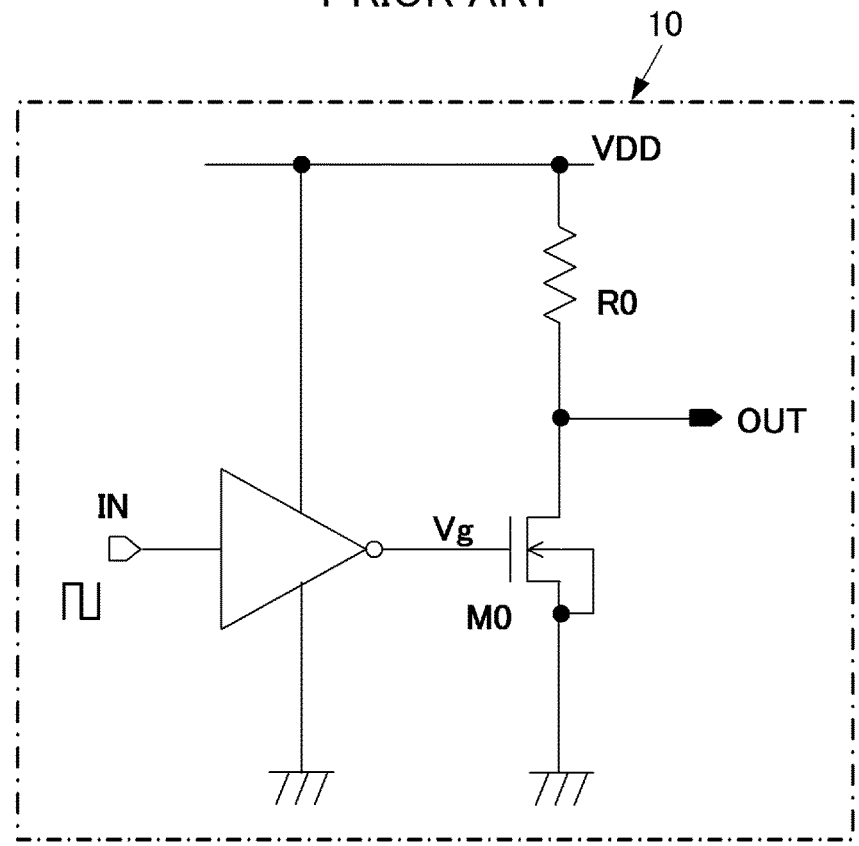
FIG. 9 is a circuit configuration view of an example of a known pulse signal sending circuit.
Figure 10:
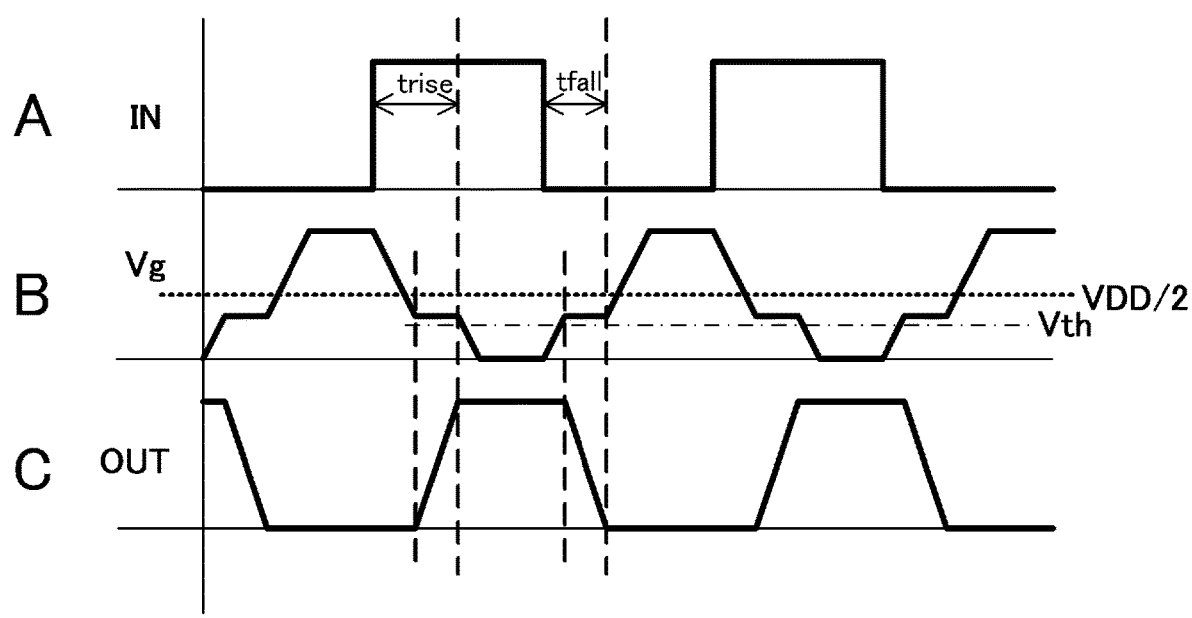
FIG. 10 is a waveform chart showing relationship between input signals IN, electric potential of an internal node, and output voltage OUT of the known pulse signal sending circuit shown in FIG. 9.

According to the known pulse signal sending circuit shown in FIG. 9, the rising lag time (trise) of the output waveform is different from the falling lag time (tfall) thereof, as shown in FIG. 10. This is because the threshold voltage of the MOS transistor M0 of the output stage 11 is equal to or smaller than the half of the power-supply voltage VDD (VDD/2) and accordingly, the MOS transistor M0 is turned on and the drain current starts flowing before the voltage of the gate terminal reaches VDD/2. On the other hand, the pulse signal sending circuit in the embodiment shown in FIG. 1 includes the falling delay circuit 13 to delay the timing when the MOS transistor MO of the output stage 11 is turned on. As a result, the rising lag time (trise) and the falling lag time (tfall) of the output waveform become equal.

Figure 2B:
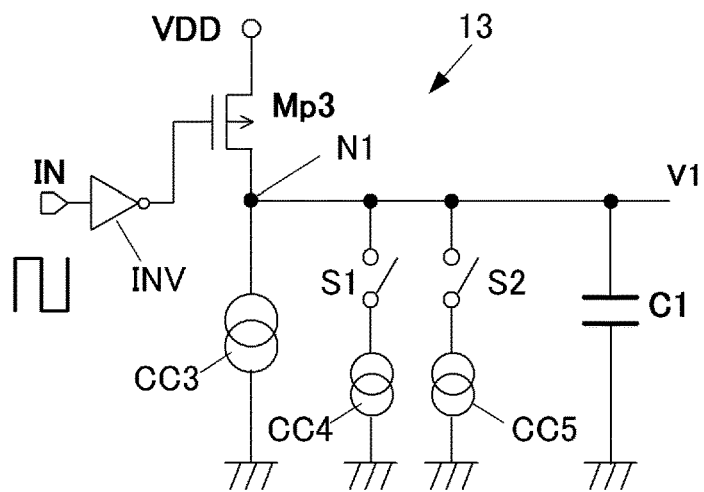
Figure 3A:
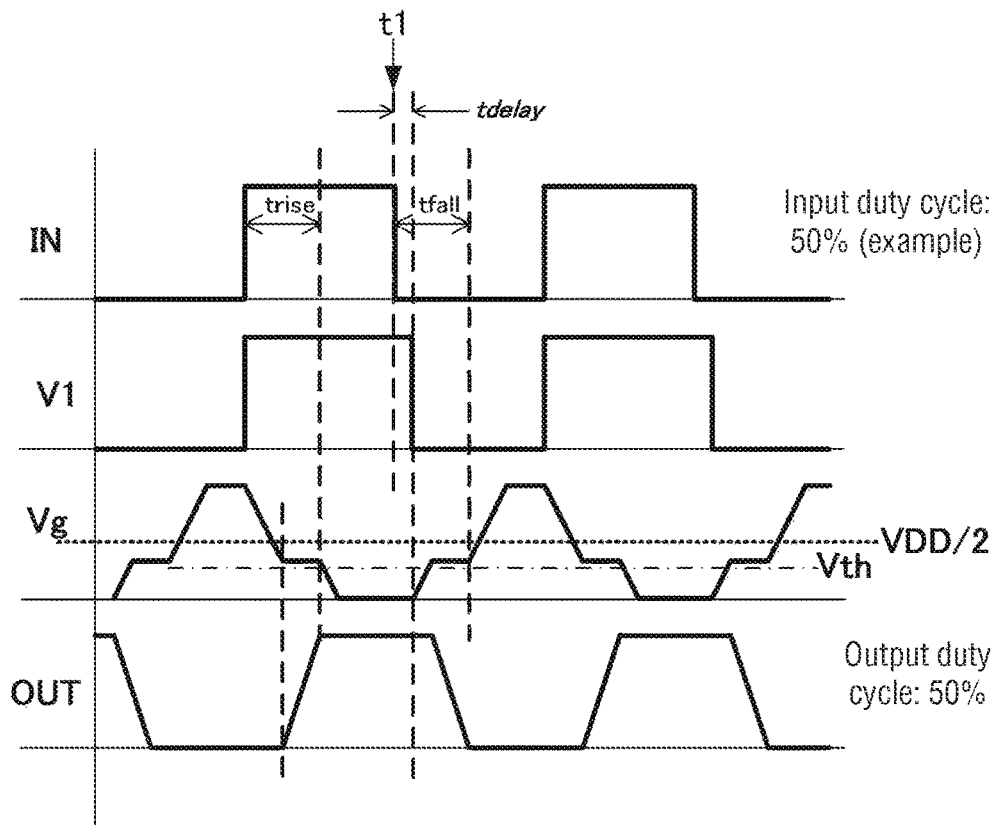
FIGS. 3A, 3B are waveform charts showing relationship between input signals IN, electric potential of an internal node, and output voltage OUT of the pulse signal sending circuit in the first embodiment and a modification of the first embodiment.
Figure 3B:
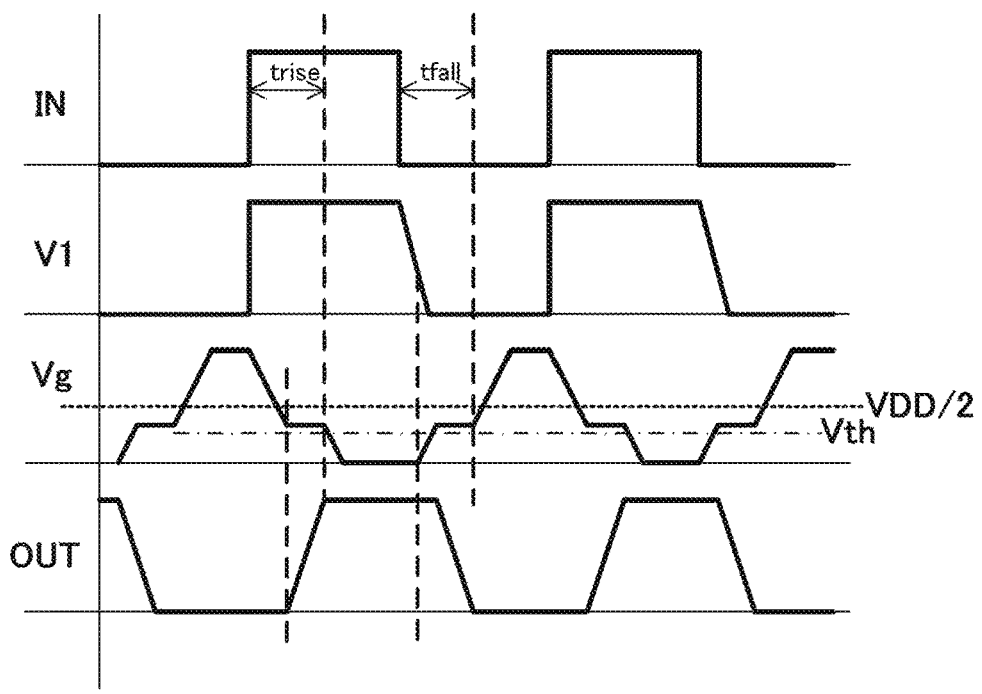

FIG. 3A shows relationship between input signals IN, electric potential V1 of the internal node N1, gate voltage Vg of the MOS transistor M0, and output voltage OUT of the pulse signal sending circuit 10 in the embodiment of FIG. 1. FIG. 3B shows the case where the pulse signal sending circuit 10 in FIG. 1 uses the circuit of FIG. 2B as the falling delay circuit 13.

In FIGS. 3A, 3B, Vth is the threshold voltage of the MOS transistor M0 and is smaller than VDD/2. Such relationship can be set by setting the power-supply voltage VDD of the resistor RO to be greater than twice the threshold voltage Vth. The gate voltage Vg of the MOS transistor M0 becomes temporarily flat in rising and falling. This is due to feedback capacitance of the gate terminal of the MOS transistor MO. While the gate voltage Vg is flat (flat time), the output voltage OUT changes. By designing the circuit such that the flat time has an adequate length, the actual rising lag time and falling lag time of the output waveform can be set.

As shown in FIG. 3A, in the pulse signal sending circuit 10 in the embodiment of FIG. 1, the falling delay circuit 13 delays the falling of the electric potential V1 of the node N1 by the delay time (tdelay) from the timing t1 at which the input signal IN falls. As a result, the rising lag time (trise) and the falling lag time (tfall) of the output waveform become equal.

In other words, the delay time (tdelay) of the falling delay circuit 13 is set such that trise=tfall holds. As a result, the pulse width and duty cycle of the output voltage OUT are the same as the pulse width and duty cycle of the input signals IN, thereby being prevented from changing. FIG. 3B also shows the same result.

As described above, when square-wave signals IN as shown in the A part of FIG. 10 are input to the preceding CMOS inverter in the pulse signal sending circuit shown in FIG. 9, the pulse signal sending circuit outputs signals the waveform of which gently rises and falls, as shown in the C part of FIG. 10. However, the rising lag time (trise) and the falling lag time (tfall) of the output waveform are not equal. As a result, the pulse width and duty cycle of the output signals OUT are different from the pulse width and duty cycle of the input signals IN. The pulse signal sending circuit 10 in this embodiment, on the other hand, sets the delay time (tdelay) of the falling delay circuit 13 such that trise=tfall holds. As a result, the pulse width and duty cycle of the output voltage OUT are the same as the pulse width and duty cycle of the input signals IN, thereby being prevented from changing.

Further, in the pulse signal sending circuit 10 in the embodiment of FIG. 1, the constant current sources CC1, CC2 that are connected in series to the P-channel MOS transistor M1 and the N-channel MOS transistor M2. Accordingly, the pulse signal sending circuit 10 in this embodiment can more accurately adjust the slopes of rising and falling of waveforms of the gate voltage Vg of the MOS transistor M0 and the output voltage OUT to desired gradients, as compared with the known pulse signal sending circuit in FIG. 9, which does not include the constant current sources CC1, CC2. The pulse signal sending circuit 10 in the embodiment of FIG. 1, however, may omit the constant current sources CC1, CC2. In the case, slopes of the output waveforms may be adjusted with the design of the MOS transistor M0 in the output stage 11, as with the known circuit.

Part of the pulse signal sending circuit 10 in FIG. 1 except the resistor RO may be formed as a semiconductor integrated circuit (regulator IC) on a semiconductor chip, such as a single crystal silicon. The load resistor may be an external element connected between an external terminal and a power-supply voltage terminal, or may be a pull-up resistor connected between an input terminal and a power-supply voltage terminal of a receiving circuit.

Signal transmission that is performed through such an open-drain circuit and required to deal with electromagnetic interference may be regulated by the Local Interconnect Network (LIN), which is a communications protocol for in-vehicle systems. The pulse signal sending circuit in this embodiment is applicable to a signal sending circuit that constitutes a system having the LIN bus. The LIN requires the duty cycle of transmission signals (pulses) to be 50%. This embodiment is also applicable to a signal sending circuit constituting an in-vehicle network system that performs communication in conformity with the Controller Area Network (CAN).

When the pulse signal sending circuit 10 in this embodiment is an open-drain circuit as an example, the falling delay circuit 13 may further include: constant current sources CC4, CC5, . . . that are arranged in parallel with the constant current source CC3; and switches S1, S2, . . . that are connected in series to the respective constant current sources CC4, CC5, . . . , as shown in FIG. 2B. With this configuration, the pulse signal sending circuit 10 switches current values for the capacitor C1 to discharge electricity according to resistance values of the pull-up resistor in a signal receiving circuit, thereby changing the falling lag time (tfall) of the output waveform. The pulse signal sending circuit 10 thus can make the rising lag time (trise) and the falling lag time (tfall) of the output waveform to be equal, irrespective of the power-supply voltage VDD of the pull-up resistor RO. The open-drain pulse signal sending circuit 10 can therefore effectively prevent changes in the pulse width and duty cycle of the output voltage OUT. The pulse signal sending circuit 10 may be configured to switch capacitance values of the capacitor C1 instead of switching current values (constant current source) for the capacitor C1 to discharge electricity.

Figure 4:
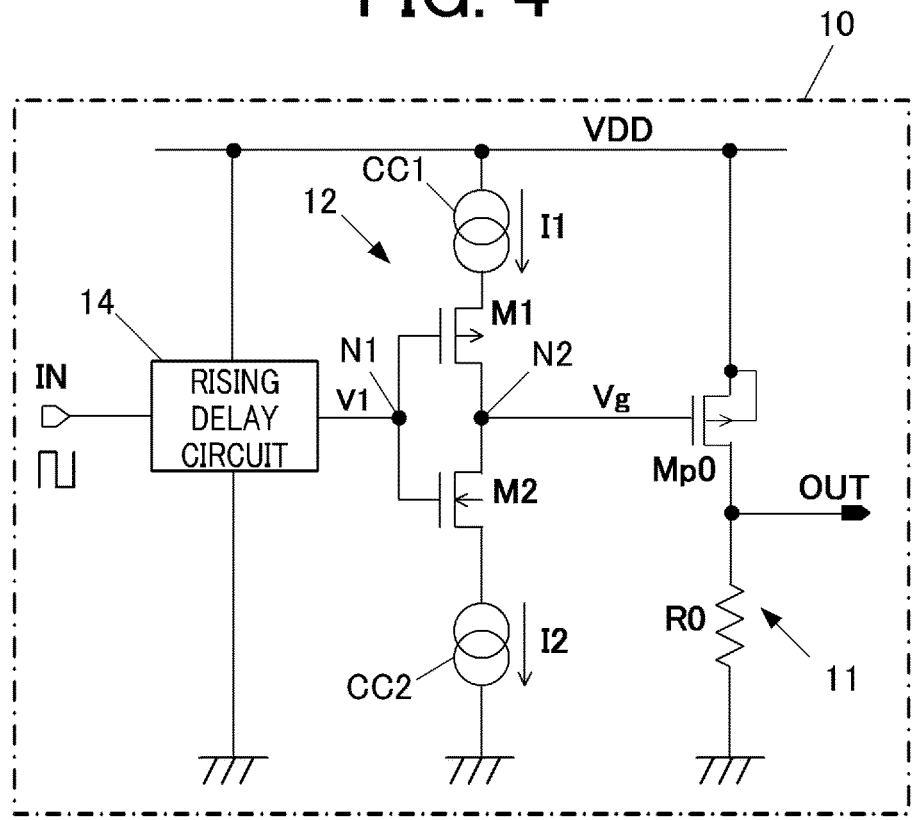
FIG. 4 is a circuit configuration view of a first modification of the pulse signal sending circuit in the first embodiment.

FIG. 4 shows a first modification of the pulse signal sending circuit 10 in the first embodiment.

In the first modification, the first embodiment (FIG. 1) is applied to a circuit that includes a P-channel MOS transistor Mp0 instead of the N-channel MOS transistor as the MOS transistor M0 of the output stage 11. The pulse signal sending circuit 10 in the first modification includes a rising delay circuit 14 instead of the falling delay circuit 13. Further, the threshold voltage Vthp of the MOS transistor Mp0 is greater than VDD/2. Such a threshold voltage can be set by setting the power-supply voltage VDD of the resistor RO to be greater than twice the threshold voltage Vthp.

Figure 5:
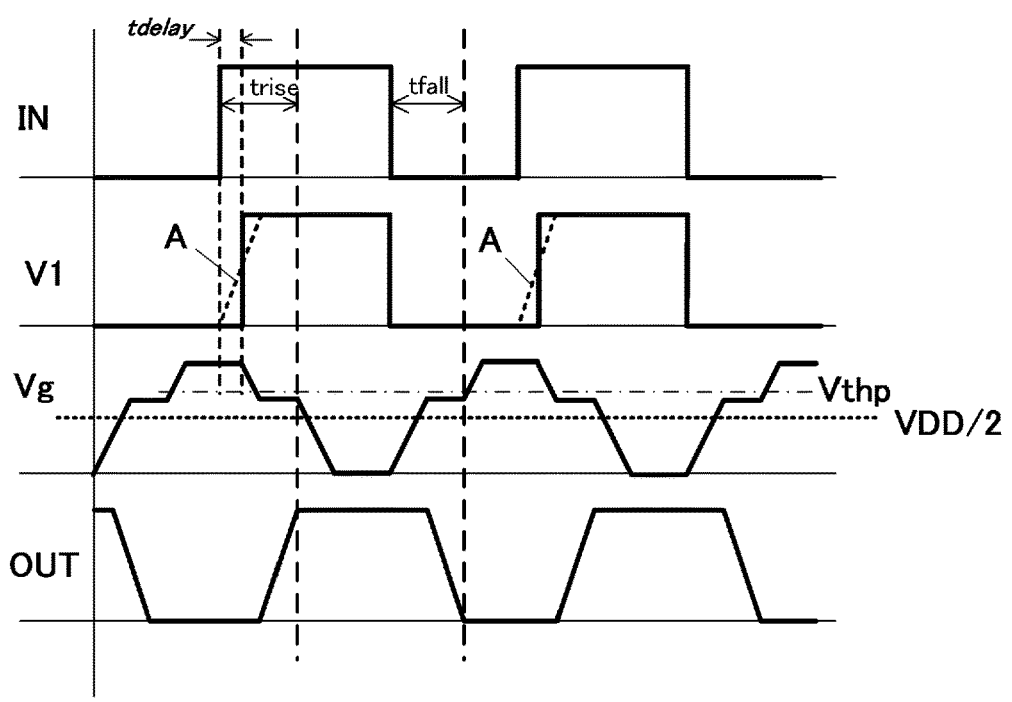
FIG. 5 is a waveform chart showing relationship between input signals IN, electric potential of an internal node, and output voltage OUT of the pulse signal sending circuit in the first modification.

FIG. 5 is a timing chart of the first modification. As shown in FIG. 5, the rising lag time (trise) and the falling lag time (tfall) of the waveform of the output voltage OUT are equal because the pulse signal sending circuit 10 in this modification includes the rising delay circuit 14. The pulse signal sending circuit 10 thus can effectively prevent changes in the pulse width and duty cycle of the output voltage OUT.

Figure 2C:
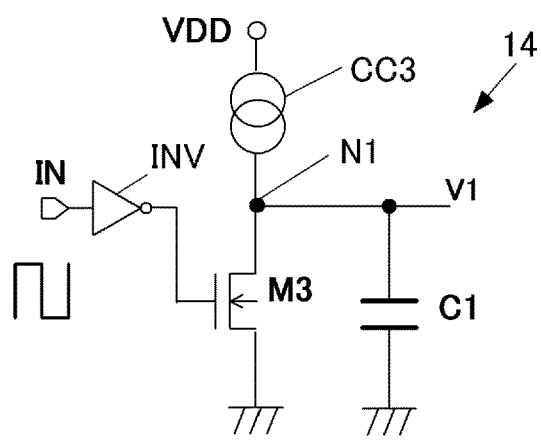
FIG. 2C is a circuit diagram that shows a specific example of a rising delay circuit constituting a modification of the first embodiment.

FIG. 2C shows a specific example of the rising delay circuit 14 in the first modification. The rising delay circuit in FIG. 2C includes: an inverter INV that inverts input signals IN; a constant current source CC3 and an N-channel MOS transistor M3 that are connected in series between the power-supply voltage terminal and a grounding point; and a capacitor C1 that is connected between a grounding point and a connecting node N1 that connects the MOS transistor M3 and the constant current source CC3. The timing chart of the pulse signal sending circuit 10 including the rising delay circuit 14 in FIG. 2C is omitted because it is almost the same as the timing chart in FIG. 5, except that the electric potential V1 of the node N1 rises more gently as shown by the dash line A in FIG. 5.

Figure 6:
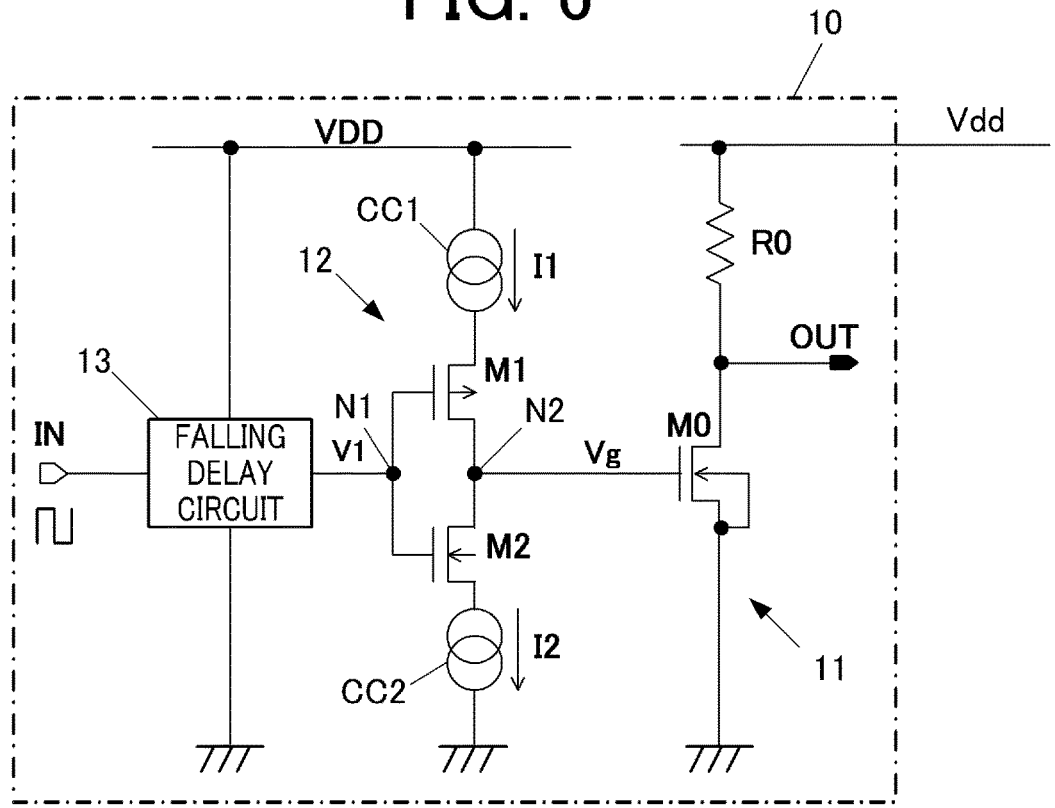
FIG. 6 is a circuit configuration view of a second modification of the pulse signal sending circuit in the first embodiment.

FIG. 6 shows a second modification of the pulse signal sending circuit 10 in the first embodiment. In the second modification, the power-supply voltage Vdd for the output stage 11 is different from the power-supply voltage VDD for the CMOS inverter circuit 12 and the falling delay circuit 13. The pulse signal sending circuit 10 configured as described above can have a level shifting function of shifting the high-level electric potential of input signals IN and outputting shifted signals. When the second modification is applied to an in-vehicle system, the power-supply voltage Vdd of the output stage 11 may be a battery voltage. In the case, VDD<Vdd holds. Alternatively, VDD>Vdd may hold according to a system to be used.

Next, a second embodiment of the pulse signal sending circuit according to the present invention is described with reference to FIGS. 7, 8.

Figure 7:
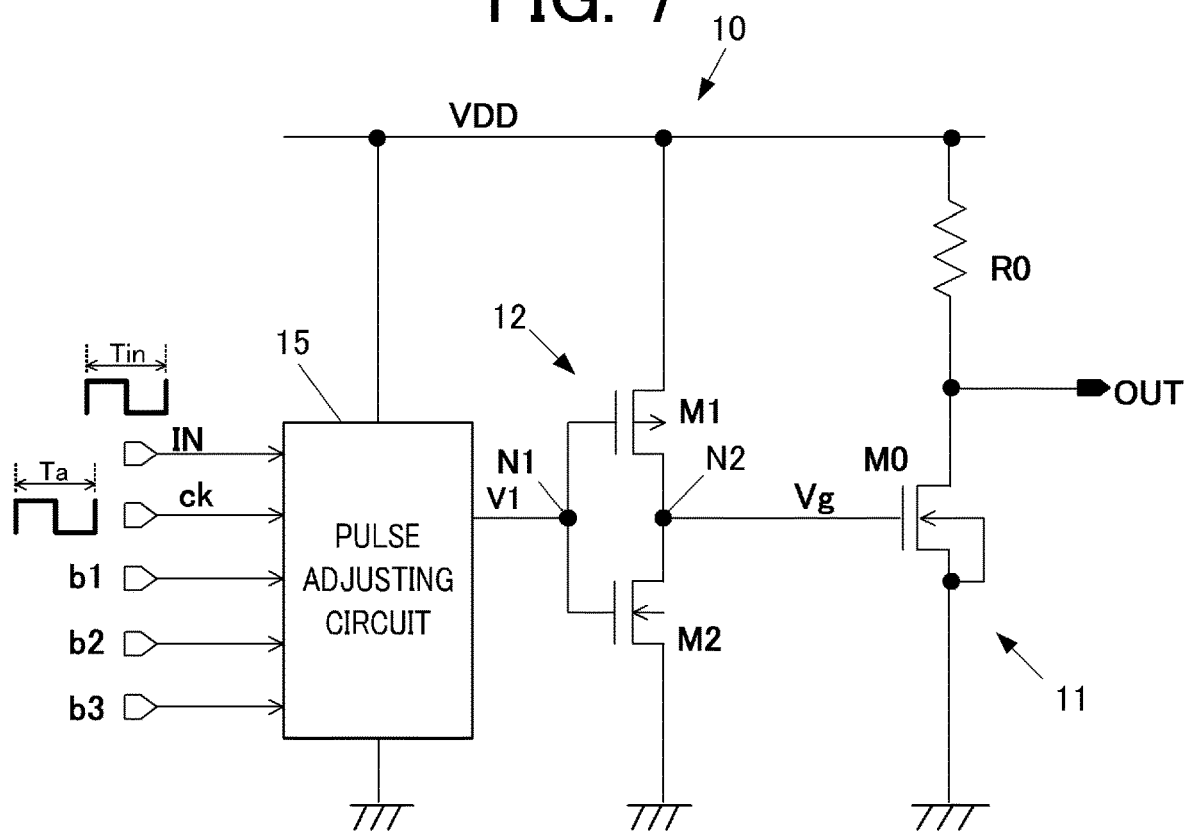
FIG. 7 is a circuit configuration view of a pulse signal sending circuit in a second embodiment.
Figure 8:
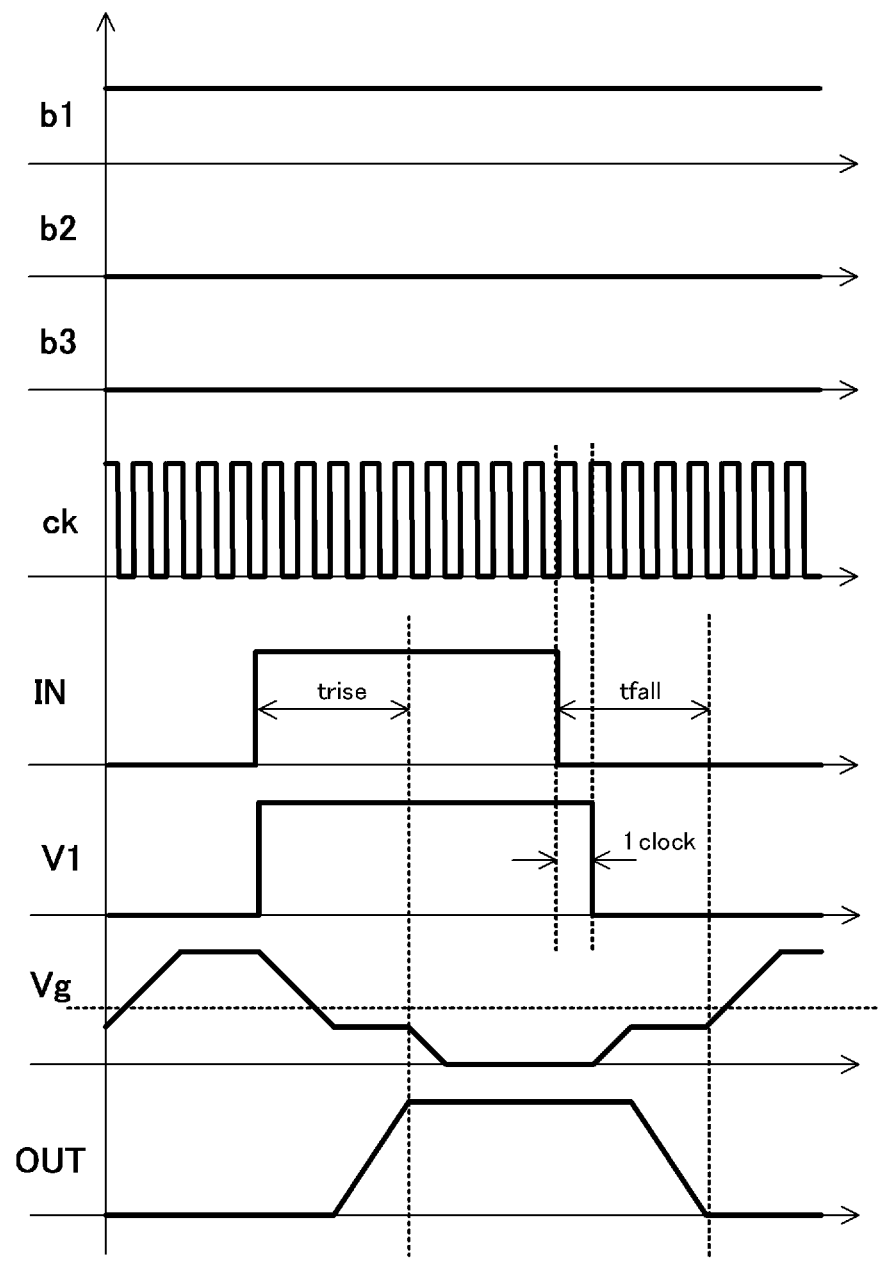
FIG. 8 is a waveform chart showing relationship between input signals IN, electric potential of an internal node, and output voltage OUT of the pulse signal sending circuit in the second embodiment.

The pulse signal sending circuit in the second embodiment includes, as shown in FIG. 7, a pulse adjusting circuit 15 instead of the falling delay circuit 13 in the first embodiment in FIG. 1. The pulse adjusting circuit 15 changes the pulse width of input pulse signals IN and outputs the pulse signals with the changed pulse width. The pulse adjusting circuit 15 performs the function of the falling delay circuit 13 in the first embodiment through digital processing. The pulse adjusting circuit 15 includes: a counter circuit that operates with clock signals ck; and a logic circuit that includes a logic gate circuit. The cycle (Ta) of clock signals ck is efficiently shorter than the cycle (Tin) of input pulse signals IN.

More specifically, the pulse adjusting circuit 15 receives signals b1 to b3 as control signals that have information of the cycle Tin of the input pulse signals IN. For the input pulse signals IN having a long cycle Tin, the pulse adjusting circuit 15 delays the timing at which the electric potential V1 of the node N1 falls to a low level by the length of one cycle Ta of the clock signals ck, as shown in FIG. 8. For the input pulse signals IN having a short cycle Tin, the pulse adjusting circuit 15 hastens the timing at which the electric potential V1 of the node N1 falls to the low level by the length of one cycle Ta of the clock signals ck.

Because the control signals b1 to b3 have three bits in this embodiment, the pulse adjusting circuit 15 can adjust the timing at which the electric potential V1 of the node N1 falls to the low level by eight stages.

As described above, according to an aspect of the present invention, there is provided a pulse signal sending circuit that outputs pulse signals from an output terminal. The pulse signal sending circuit includes an output transistor that includes a drain terminal connected to the output terminal; an inverter circuit that is connected to a gate terminal of the output transistor and outputs a signal to be input to the gate terminal of the output transistor; and a delay circuit that receives a pulse signal as an input and delays rising or falling of the input pulse signal, wherein the pulse signal delayed by the delay circuit is input to the inverter circuit.

The rising lag time and the falling lag time of the output waveform may not be equal owing to the slope control function given to the pulse signal sending circuit. According to the pulse signal sending circuit having the above configuration, the delay circuit delays either the rising or falling of the input pulse signals and inputs the delayed pulse signals to the inverter circuit that drives the output transistor.

As a result, the pulse signal sending circuit can send pulse signals the pulse width and duty cycle of which are unchanged. Further, pulse signals can be sent from an open drain circuit.

Preferably, the inverter circuit is a CMOS inverter circuit that includes a P-channel MOS transistor and an N-channel MOS transistor that are connected in series; the P-channel MOS transistor is connected in series to a first constant-current source between a first power-supply voltage terminal and an output node; and the N-channel MOS transistor is connected in series to a second constant-current source between the output node and a second power-supply voltage terminal.

According to this configuration, the pulse signal sending circuit can adjust the change speed of the gate voltage of the output transistor with electric currents of the constant current sources. The pulse signal control circuit thus can control slopes of rising and/or falling of the output waveform.

Preferably, a resistance element is connected between a first power-supply voltage terminal or a second power-supply voltage terminal and the drain terminal of the output transistor.

According to this configuration, pulse signals can be sent out without a pull-up or pull-down resistor in a circuit that receives sent pulse signals.

Preferably, different power-source voltages are applied to: the first power-supply voltage terminal or the second power-supply voltage terminal to which the resistance element is connected; and a power-supply voltage terminal to which the delay circuit and the inverter circuit are connected.

According to this configuration, the pulse signal sending circuit can level-shift the input pulse signals and output the level-shifted pulse signals, without changing the pulse width and duty cycle of the input pulse signals.

Preferably, the delay circuit adjusts an amount of delay.

The difference between the rising lag time and the falling lag time of the output waveform may vary depending on the systems to which the pulse signal sending circuit is applied, because the systems may use pulse signals having different cycles. By adjusting the amount of delay with the delay circuit, the pulse signal sending circuit can send pulse signals the pulse width and duty cycle of which are unchanged.

Preferably, the delay circuit includes: a switch MOS transistor and a constant-current source that are connected in series between a first power-supply voltage terminal and a second power-supply voltage terminal; and a capacitance element that is connected between a connecting node and a second power-supply voltage terminal or a first power-supply voltage terminal, the connecting node connecting the switch MOS transistor and the constant-current source.

According to this configuration, the delay circuit can be relatively small and simple in configuration to delay falling or rising of input pulse signals.

The pulse signal sending circuit according to the present invention can send pulse signals the pulse width and duty cycle of which are unchanged, without greatly upsizing the circuit and the chip. Further, the pulse signal sending circuit can accurately control the slopes of the output waveform.

Although some embodiments of the present invention by the inventor have been described in detail, the present invention is not limited to the above embodiments. For example, in the first embodiment, the constant current sources CC1, CC2 that constitute the CMOS inverter circuit 12 have the same current values I1, I2. However, in the pulse signal sending circuit 10 having a level shift function in the second modification, the constant current sources CC1, CC2 may have different current values I1, I2.

Further, although the pulse signal sending circuit 10 is configured as one semiconductor integrated circuit in the above embodiments, the pulse signal sending circuit 10 may be a circuit that performs a signal sending function in a semiconductor integrated circuit having various functions.

What is claimed is:

1. A pulse signal sending circuit that outputs an output pulse signal at an output terminal, the circuit comprising:
   an output transistor that includes a drain terminal connected to the output terminal;
   an inverter circuit that is connected to a gate terminal of the output transistor and outputs a signal to be input to the gate terminal of the output transistor; and
   a delay circuit that receives an input pulse signal as an input and delays only rising or only falling of the input pulse signal, wherein:
   the input pulse signal delayed by the delay circuit is input to the inverter circuit, and
   a duty cycle of the output pulse signal at the output terminal is controlled to be 50% when a duty cycle of the input pulse signal is 50%.

2. The pulse signal sending circuit according to claim 1, wherein:
   the inverter circuit is a CMOS inverter circuit that includes a P-channel MOS transistor and an N-channel MOS transistor that are connected in series,
   the P-channel MOS transistor is connected in series to a first constant-current source between a first power-supply voltage terminal and an output node, and
   the N-channel MOS transistor is connected in series to a second constant-current source between the output node and a second power-supply voltage terminal.

3. The pulse signal sending circuit according to claim 1, wherein a resistance element is connected between a first power-supply voltage terminal or a second power-supply voltage terminal and the drain terminal of the output transistor.

4. The pulse signal sending circuit according to claim 3, wherein different power-source voltages are applied to:
   the first power-supply voltage terminal or the second power-supply voltage terminal to which the resistance element is connected and
   a power-supply voltage terminal to which the delay circuit and the inverter circuit are connected.

5. The pulse signal sending circuit according to claim 1, wherein the delay circuit adjusts an amount of delay of the input pulse signal.

6. The pulse signal sending circuit according to claim 1, wherein the delay circuit includes:
   a switch MOS transistor and a constant-current source that are connected in series between a first power-supply voltage terminal and a second power-supply voltage terminal; and
   a capacitance element that is connected between a connecting node and the second power-supply voltage terminal or the first power-supply voltage terminal, the connecting node connecting the switch MOS transistor and the constant-current source.

7. The pulse signal sending circuit according to claim 1, wherein the pulse signal sending circuit performs control such that a rising time of the output pulse signal is equal to a falling time thereof, where the rising time is a time required for the output pulse signal at the output terminal to rise, and the falling time is a time required for the output pulse signal at the output terminal to fall.

8. A pulse signal sending circuit that outputs an output pulse signal at an output terminal, the circuit comprising:
   an output transistor that includes a drain terminal connected to the output terminal;
   an inverter circuit that is connected to a gate terminal of the output transistor and outputs a signal to be input to the gate terminal of the output transistor; and
   a delay circuit that receives an input pulse signal as an input and delays only rising or only falling of the input pulse signal,
   wherein:
   the input pulse signal delayed by the delay circuit is input to the inverter circuit,
   the pulse signal sending circuit performs control such that a rising time of the output pulse signal is equal to a falling time thereof, where the rising time is time required for the output pulse signal at the output terminal to rise, and the falling time is time required for the output pulse signal at the output terminal to fall,
   the inverter circuit is a CMOS inverter circuit that includes a P-channel MOS transistor and an N-channel MOS transistor that are connected in series,
   the P-channel MOS transistor is connected in series to a first constant-current source between a first power-supply voltage terminal and an output node, and
   the N-channel MOS transistor is connected in series to a second constant-current source between the output node and a second power-supply voltage terminal.

9. The pulse signal sending circuit according to claim 8, wherein a resistance element is connected between the first power-supply voltage terminal or the second power-supply voltage terminal and the drain terminal of the output transistor.

10. The pulse signal sending circuit according to claim 9, wherein different power-source voltages are applied to:
   the first power-supply voltage terminal or the second power-supply voltage terminal to which the resistance element is connected and
   a power-supply voltage terminal to which the delay circuit and the inverter circuit are connected.

11. The pulse signal sending circuit according to claim 8, wherein the delay circuit adjusts an amount of delay of the input pulse signal.

12. The pulse signal sending circuit according to claim 8, wherein the delay circuit includes:
   a switch MOS transistor and a constant-current source that are connected in series between the first power-supply voltage terminal and the second power-supply voltage terminal; and
   a capacitance element that is connected between a connecting node and the second power-supply voltage terminal or the first power-supply voltage terminal, the connecting node connecting the switch MOS transistor and the constant-current source.

13. A pulse signal sending circuit that outputs an output pulse signal at an output terminal, the circuit comprising:
   an output transistor that includes a drain terminal connected to the output terminal;
   an inverter circuit that is connected to a gate terminal of the output transistor and outputs a signal to be input to the gate terminal of the output transistor; and
   a delay circuit that receives an input pulse signal as an input and delays only rising or only falling of the input pulse signal, wherein
   the input pulse signal delayed by the delay circuit is input to the inverter circuit, and
   a duty cycle of the output pulse signal at the output terminal is controlled to be equal to a duty cycle of the input pulse signal.

\* \* \* \* \*